United States Patent
Nodo et al.

(10) Patent No.: US 8,263,875 B2
(45) Date of Patent: Sep. 11, 2012

(54) SURFACE MOUNTING STRUCTURE FOR A SURFACE MOUNTING ELECTRONIC COMPONENT

(75) Inventors: Takamasa Nodo, Kariya (JP); Haruo Takagi, Kariya (JP)

(73) Assignee: Kabushiki Kaisha Toyota Jidoshokki, Aichi-ken (JP)

( * ) Notice: Subject to any disclaimer, the term of this patent is extended or adjusted under 35 U.S.C. 154(b) by 1093 days.

(21) Appl. No.: 11/901,078

(22) Filed: Sep. 13, 2007

(65) Prior Publication Data

US 2008/0066955 A1 Mar. 20, 2008

(30) Foreign Application Priority Data

Sep. 15, 2006 (JP) ................ P2006-251714

(51) Int. Cl.
*H05K 1/16* (2006.01)
(52) U.S. Cl. .......... 174/260; 174/252
(58) Field of Classification Search .......... 174/252, 174/260, 261
See application file for complete search history.

(56) References Cited

U.S. PATENT DOCUMENTS

| | | | | |
|---|---|---|---|---|
| 3,967,296 | A * | 6/1976 | Intrator | 257/778 |
| 4,870,225 | A * | 9/1989 | Anao et al. | 174/261 |
| 4,874,907 | A * | 10/1989 | Ishikawa | 174/261 |
| 5,835,352 | A * | 11/1998 | Matsuzaki et al. | 361/707 |
| 5,973,923 | A * | 10/1999 | Jitaru | 361/704 |
| 6,316,736 | B1 * | 11/2001 | Jairazbhoy et al. | 174/260 |
| 6,633,005 | B2 * | 10/2003 | Ichitsubo et al. | 174/260 |
| 6,657,697 | B2 * | 12/2003 | Yamate et al. | 349/151 |
| 7,186,926 | B2 * | 3/2007 | Maeno | 174/260 |
| 7,626,124 | B2 * | 12/2009 | Okamoto | 174/252 |
| 2003/0150641 | A1 * | 8/2003 | Kinayman et al. | 174/255 |
| 2005/0056458 | A1 * | 3/2005 | Sugiura | 174/260 |

FOREIGN PATENT DOCUMENTS

| | | |
|---|---|---|
| JP | 3-50368 U | 5/1991 |
| JP | 4-121778 U | 10/1992 |
| JP | 2004-207565 A | 7/2004 |
| JP | 2004-319778 A | 11/2004 |
| JP | 2005-39113 A | 2/2005 |

OTHER PUBLICATIONS

Japanese Office Action, application No. 2006-251714, issued Feb. 8, 2011.
Japanese Office Action, application No. 2006-251714, issued Nov. 8, 2011, (consulted translator to confirm that no relevance is there to the invention in the report. Also, clarified with the applicant's representative Steven Meyer).

* cited by examiner

*Primary Examiner* — Ishwarbhai Patel
(74) *Attorney, Agent, or Firm* — Locke Lord LLP

(57) ABSTRACT

A surface mounting structure for a surface mounting electronic component has an electronic component, a land, a wiring, and an electrical connection pattern. The electronic component has electrodes at opposite ends thereof. The land is connected to each electrode through a solder. The wiring is connected to the land and has a width which is smaller than a width of the electronic component in a width direction thereof. The wiring is connected to the electrical connection pattern. The electrical connection pattern has on a side on which the wiring is connected to the electrical connection pattern a width which is larger than the width of the electronic component in the width direction thereof.

14 Claims, 5 Drawing Sheets

SURFACE MOUNTING STRUCTURE FOR A SURFACE MOUNTING ELECTRONIC COMPONENT

BACKGROUND OF THE INVENTION

The present invention relates to a surface mounting structure for a surface mounting electronic component.

Recently, a surface mounting technique has been used wherein the electrodes of an electronic component are connected to wiring patterns on the surface of a substrate as part of the process for manufacturing a high density of electronic devices on the substrate. FIGS. 4A-4C are top views showing conventional surface mounting structures. These structures are in the form of chip components 42 such as chip resistors, capacitors and the like which are connected through solder to wide patterns 41 as an electrical connection pattern formed on a metal substrate 40.

A case is assumed where the surface mounting structures in FIGS. 4A-4C are incorporated into an in-vehicle electronic circuit which is assumed to be used under severe temperature conditions such as from sub-zero degree to several tens of degrees Celsius. When each of the wide patterns 41, the chip components 42 and the like repeatedly expand and contract due to temperature changes, a crack may be initiated in a solder 43 between the upper surface of the wide pattern 41 and the bottom surface of the chip component 42, as shown, for example, in FIG. 5A. The crack may eventually propagate through the solder 43, leading to the possibility that the wide pattern 41 and the chip component 42 become electrically disconnected from each other, thereby resulting in an electrically open state.

Conventionally, to prevent the formation of a crack in the solder 43, the volume of the solder 43 supplied is adjusted so that the solder 43 is formed into a fillet matching the size of the chip component 42 as shown by FIG. 5B. Furthermore, the shape of the land to which the bottom surface of the chip component 42 is attached with solder is modified to minimize stress of the solder between the bottom surface of the chip component 42 and the land where a crack may be generated initially (cf. Unexamined Japanese Patent Publication No. 2005-228885). Despite improvements shown in FIG. 5B, there remains the possibility that a crack may be generated and subsequently propagate through the solder 43.

Thus the present invention is directed to an improved surface mounting structure for a surface mounting electronic component which prevents crack formation due to thermal stress in the solder connecting the electronic component 42 and the wide pattern 41.

SUMMARY OF THE INVENTION

In one aspect in accordance with the present invention, there is provided a surface mounting structure for a surface mounting electronic component. The surface mounting structure comprises an electronic component, a land, a wiring, and an electrical connection pattern. The electronic component has electrodes at opposite ends thereof. The land is connected to each electrode through a solder. The wiring is connected to the land and has a width which is smaller than a width of the electronic component in a width direction thereof. The wiring is connected to the electrical connection pattern. The electrical connection pattern has on a side on which the wiring is connected to the electrical connection pattern a width which is larger than the width of the electronic component in the width direction thereof.

Other aspects and advantages of the invention will become apparent from the following description which, when taken in conjunction with the accompanying drawings, illustrates by way of example the principles of the invention.

BRIEF DESCRIPTION OF THE DRAWINGS

Features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF THE PREFERRED EMBODIMENTS

Figure 1A:
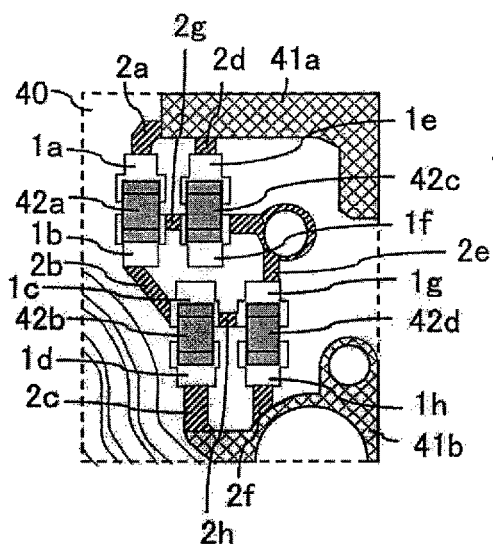
FIGS. 1A-1D are top views showing a surface mounting structure of a preferred embodiment according to the present invention.

The following will describe a preferred embodiment according to the present invention with reference to the drawings. FIGS. 1A-1D are top views of surface mounting structures for a surface mounting electronic component in the preferred embodiment according to the present invention. It is noted that FIGS. 1A, 1B and 1D correspond to FIGS. 4A-4C, respectively. FIG. 1C is an enlarged sectional view of the area outlined by the dotted line A in FIG. 1B. It is further noted that the solder is not shown in these drawings.

A characterized feature of the preferred embodiment is that a wide pattern 41 as an electrical connection pattern and a land 1 to which a chip component 42 is connected, or lands 1 are electrically connected to each other through a wiring 2. An example is shown by FIG. 1C. Here, the wiring 2j has a width L1 which is smaller than the width L2 of a chip component 42e in the width direction thereof. It is noted that in the surface mounting structure of the preferred embodiment, the wide pattern 41d has, on a side on which the wiring 2j is connected to the wide pattern 41d, a width L3 which is larger than the width L2 of the chip component 42e.

As described above, in the surface mounting structure of the preferred embodiment, the wide pattern 41d and the land 1j are connected to the each other through the wiring 2j having the width L1 which is smaller than the width L2 of the chip component 42e and the width L3 of the wide pattern 41d. Thus, the wiring 2j is capable of absorbing stress, which may be present in the solder between the chip component 42e and the land 1j due to thermal expansion and contraction of each element such as the chip component 42, the wide pattern 41, the land 1, and the like. As an example, in the case of using hard and fragile lead-free solder, a crack can be substantially prevented from being generated in the solder due to thermal stress. Thus, the lifetime of the bond between the chip component 42 and the land 1 is improved. This eliminates the need to apply adhesives to the joint between the chip component 42 and the land 1, with the end result being a reduction in the number of the processes for surface mounting and, hence a lower manufacturing cost.

As the width L1 of the wiring 2 is decreased, the wiring 2 bends more easily, thereby increasing its capability of absorbing stress which would otherwise be applied to the solder. It is preferable that the width L1 of the wiring 2 be decreased only insofar as electrical noise generated in the wiring 2 and the resistance of the wiring 2 do not exceed predetermined values. For example, the width L1 of the wiring 2 is preferably set at about 0.5 mm, which is an experimentally verified value.

In the surface mounting structure as shown in FIG. 1A, a chip component 42a and a chip component 42c which are wired parallel to each other, and a chip component 42b and a chip component 42d which are wired parallel to each other, are connected in series between wide patterns 41a and 41b. The chip component 42a has electrodes formed at the opposite ends in the longitudinal direction, with one end soldered to a land 1a, and the other soldered to a land 1b. Similarly, the electrodes of the chip component 42b are individually soldered to lands 1c and 1d; the electrodes of the chip component 42c are individually soldered to lands 1e and 1f; and the electrodes of the chip component 42d are individually soldered to lands 1g and 1h.

In the surface mounting structure as shown in FIG. 1A, a wiring 2a, which connects the wide pattern 41a and the land 1a, is formed substantially in an L shape. A wiring 2b, which connects the lands 1b and 1c, is formed so as to incline 45 degrees with respect to the longitudinal direction of the chip component 42. A wiring 2e, which connects the lands 1f and 1g, is formed substantially in an L shape with a circular corner. Wirings 2c, 2d, and 2f, which connect the wide pattern 41 to the lands 1d, 1e, and 1h, respectively, are formed so as to extend in the longitudinal direction of the chip component 42. Wirings 2g and 2h, which connect the lands 1b-1f and 1c-1g, respectively, are formed so as to extend perpendicularly to the longitudinal direction of the chip component 42.

As described above, in the surface mounting structure as shown in FIG. 1A, the wirings 2a through 2h absorb the stresses which are applied to the solder due to expansion and contraction of each element such as the chip component 42, the wide pattern 41, the land 1 and the like. Since wirings 2a, 2b and 2e are formed with components both inclined with respect to and extending perpendicular to the longitudinal direction of the chip component 42, stress absorption can be maximized in several direction, thereby providing additional protection against crack formation.

Figure 1B:
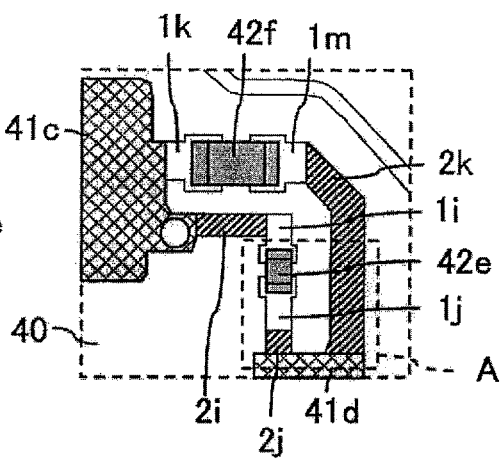
Figure 1C:
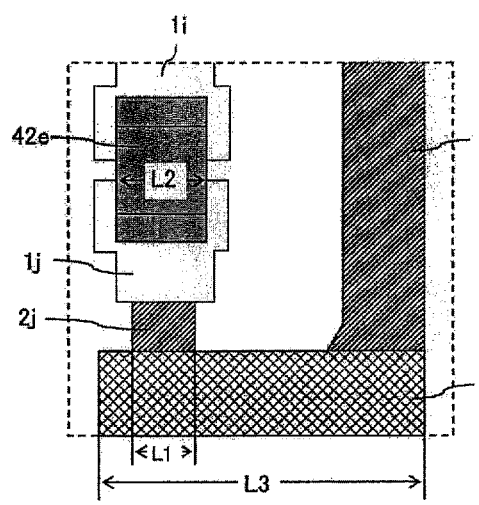

In the surface mounting structure as shown in FIG. 1B, chip components 42e and 42f are connected in parallel to each other between wide patterns 41c and 41d. The electrodes of the chip component 42e are individually soldered to lands 1i and 1j, whereas the electrodes of the chip component 42f are individually soldered to lands 1k and 1m.

In the surface mounting structure as shown in FIG. 1B, a wiring 2i, which connects the wide pattern 41c and the land 1i, is formed so as to extend perpendicularly to the longitudinal direction of the chip component 42e. A wiring 2k, which connects the wide pattern 41d and the land 1m, is formed so as to bend. A wiring 2j, which connects the wide pattern 41d and the land 1j, is formed so as to extend in the longitudinal direction of the chip component 42e. The wirings 2i through 2k absorb stress applied to the solder due to expansion and contraction of each element such as the chip component 42, the wide pattern 41, the land 1, and the like. Since the wirings 2i and 2k formed with components both inclined with respect to and extending in the longitudinal direction of the chip component 42, stress absorption can be maximized in several directions, thereby providing additional protection against crack formation.

Figure 1D:
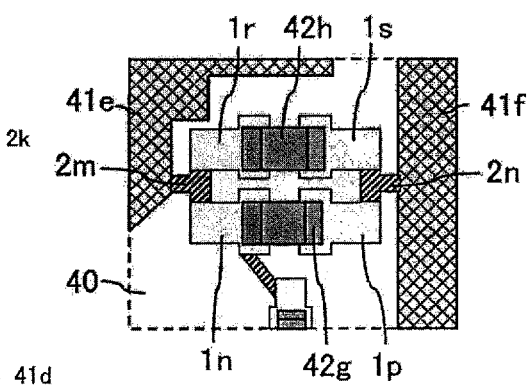

In the surface mounting structure as shown in FIG. 1D, chip components 42g and 42h are wired parallel to each other between the wide pattern 41e and the wide pattern 41f. The electrodes of the chip component 42g are individually soldered to lands 1n and 1p while the electrodes of the chip component 42h are individually soldered to lands 1r and 1s. A wiring 2m, which connects the wide pattern 41e and the lands 1n and 1r, is formed substantially in a T shape. Similarly, a wiring 2n, which connects the wide pattern 41f with the lands 1p and 1s, is formed substantially in a T shape. In other words, the wiring 2m and 2n are formed so as to branch.

As described above, in the surface mounting structure shown in FIG. 1D, the wirings 2m and 2n absorb stress applied to the solder due to expansion and contraction of each element such as the chip component 42, the wide pattern 41, the land 1 and the like. Since the wirings 2m and 2n, which connect the lands 1r-1n and 1s-1p, respectively, are formed so as to extend perpendicularly to the longitudinal direction of the chip component 42, stress absorption is maximized thereby providing additional protection against crack formation.

Figure 4A:
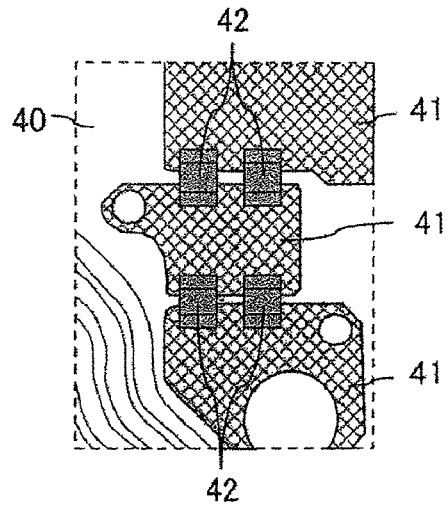
FIGS. 4A-4C are top views of typical surface mounting structures according to the background art.
Figure 4B:
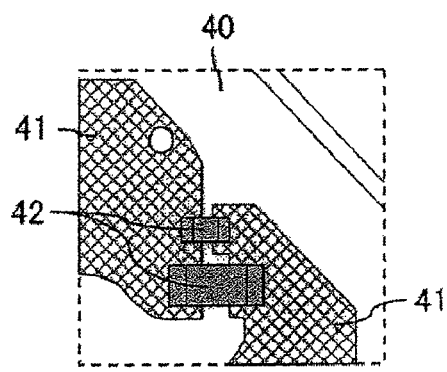
Figure 4C:
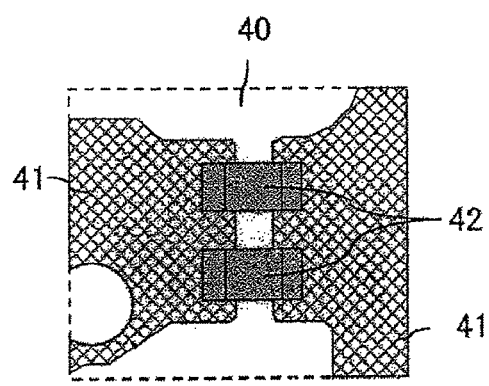
Figure 5A:
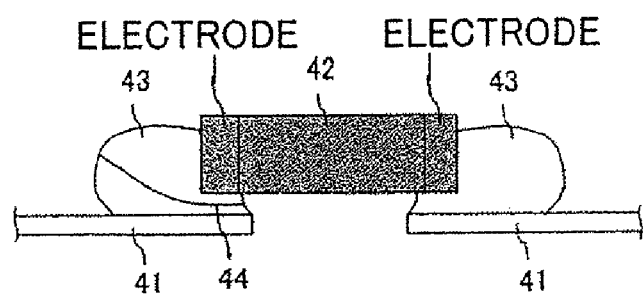
FIGS. 5A-5B are side views showing states where an electronic component is connected to wide patterns according to the background art.
Figure 5B:
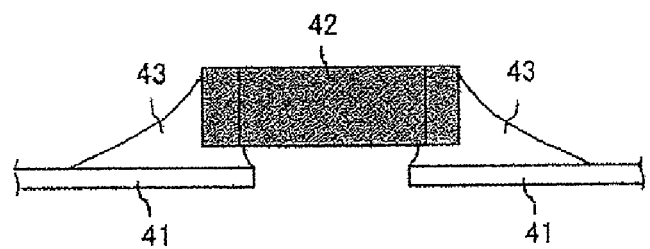

In the case where a plurality of chip components 42 are connected in parallel to each other through the wiring 2 or the wide pattern 41 as shown in FIGS. 1A-1D, the number of the wirings 2 which are connected to the wide pattern 41 is Increased, thereby increasing the area of the wide pattern 41. This results in an Increase in the coefficient of linear expansion of the wide pattern 41. Thus, in the case where the chip component 42 and the wide pattern 41 are directly connected with each other as shown in FIGS. 4A-4C, the area of the wide pattern 41 is increased, thereby increasing the stresses which are applied to the solder, with the end result being an increased probability for forming a crack. On the other hand, in the surface mounting structure of the present invention, though the area of the wide pattern 41 is increased, the stresses to the solder are absorbed by the wiring 2, thereby minimizing crack initiation and propagation. In other words, the surface mounting structure of the present invention is advantageous in the case where a plurality of chip components 42 are wired parallel to each other.

It is noted that although the wiring 2 is formed linearly, substantially in an L shape, and substantially in a T shape in the surface mounting structure as shown in FIGS. 1A-1D, the shape of the wiring 2 is not limited thereto.

The following will describe the process of surface mounting the chip component 42. In a case where the surface of the metal substrate 40 is covered with solder resist with the exception of the portion necessary for soldering the land 1, cream solder is printed on the exposed metal substrate 40. Then, the chip component 42 is subsequently mounted on the printed solder. The metal substrate 40 is then inserted into a reflow furnace where the solder is reflowed thereby to surface mount the chip component 42 on the metal substrate 40.

Figure 2A:
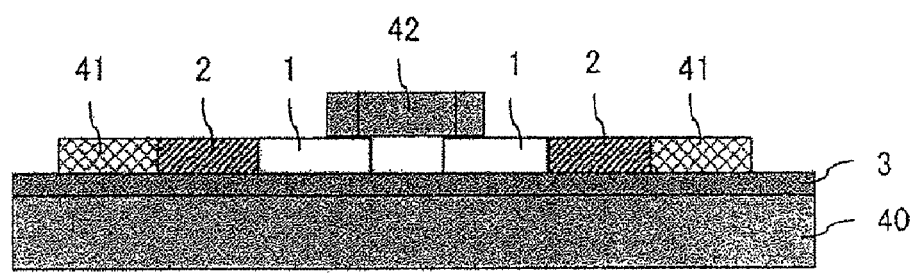
FIGS. 2A-2B are example cross-sectional views of a metal substrate.
Figure 2B:
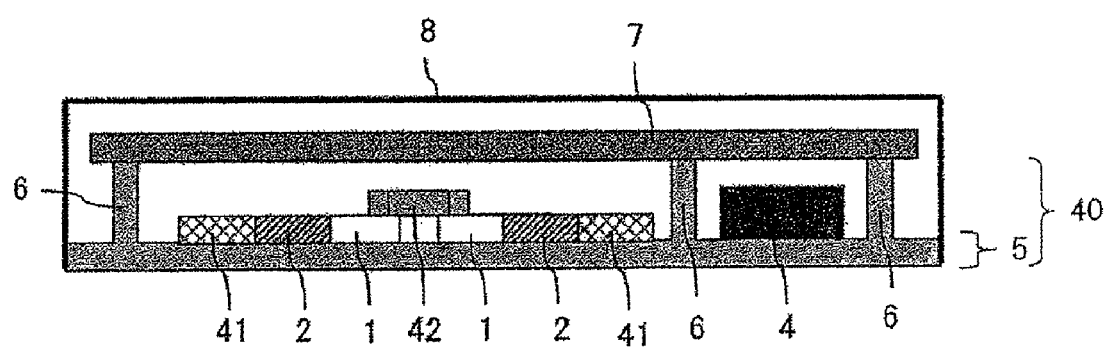

FIGS. 2A and 2B are typical cross-sectional views of the metal substrate 40 used with the surface mounting structure of the preferred embodiment. It should be noted that the solder is not shown in the drawings. An in-vehicle power supply circuit, including a DC/DC converter and an inverter, is formed on the metal substrate 40 in the preferred embodiment. In the surface mounting structure of the preferred embodiment, the chip component 42 is surface mounted on the metal substrate 40. Alternatively, a ceramic substrate may be used for surface mounting the chip component 42.

The metal substrate 40 shown in FIG. 2A is a commonly used metal substrate on which the wide pattern 41, the land 1, and the wiring 2 are formed on an insulating layer 3. The metal substrate 40 is used in a portion which requires heat radiation and thermal resistance, for example, in a portion where a power device such as a rectifying device and a switching device for forming a DC/DC converter and an inverter are mounted. Aluminum (Al), copper (Cu), iron (Fe) and the like are used for the material of the metal substrate shown in FIG. 2A.

The metal substrate 40 shown in FIG. 2B includes a base portion 5 on which a large-size component 4 such as a transformer and a coil is mounted along with the chip component 42 for forming a predetermined circuit (e.g., a DC/DC converter, or an inverter) and vertical portions 6 which are formed on the base portion 5 and extend perpendicular to the base portion 5. A glass-epoxy substrate 7 is provided on the vertical portions 6 of the metal substrate 40, and a cover 8 is provided so as to cover the metal substrate 40 and the glass-epoxy substrate 7. Al, Fe and the like are used for the material of the metal substrate 40 shown in FIG. 2B.

In the surface mounting structure of the preferred embodiment, various shapes of the metal substrate 40 can be used as shown in FIGS. 2A and 2B.

In the case where the metal substrate 40 shown in FIG. 2B is used for the surface mounting structure of the preferred embodiment, thermal grease is not required when attaching the metal substrate 40 to a casing. Thus, it is not necessary to screw-down and affix the metal substrate 40 to a casing, with cost savings being afforded due to the elimination of parts such as thermal grease and screws.

Figure 3A:
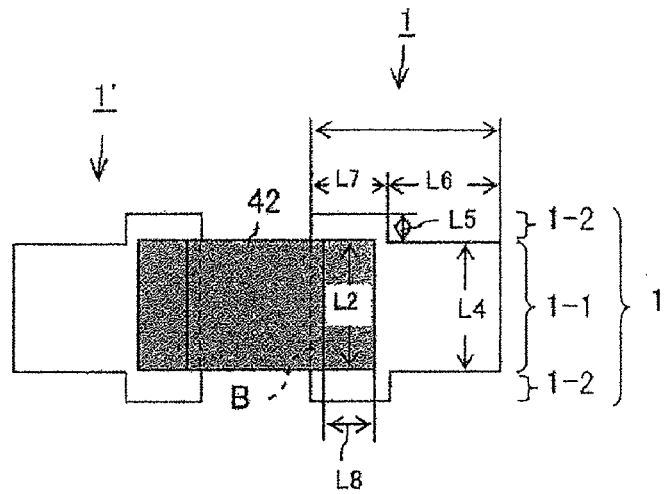
FIG. 3A is a top view showing an example of a land.
Figure 3B:
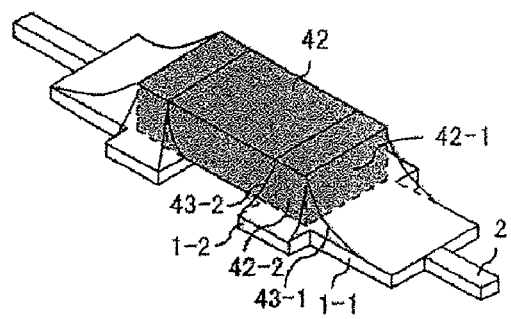
FIG. 3B is a perspective view showing the example of a land.
Figure 3C:
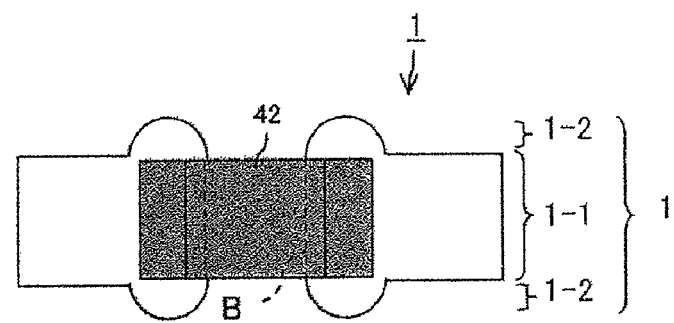
FIG. 3C is a top view showing another example of a land.

FIGS. 3A-3C show examples of the shape of the land 1. FIG. 3B shows a perspective view of the chip component 42 when mounted on the land 1 in FIG. 3A. Referring now to FIG. 3A, the land 1 includes a restriction portion 1-1 for forming thereon a front fillet 43-1 (cf. FIG. 3B) which restricts the movement of the chip component 42 when melting solder. The front fillet 43-1 faces the end face 42-1 of the chip component 42 in the direction perpendicular to the longitudinal direction of the chip component 42. The land 1 is also comprised of a pair of projections 1-2 for forming thereon side fillets 43-2 (cf. FIG. 3B) which face the side faces 42-2 of the chip component 42 in the longitudinal direction of the chip component 42.

The restriction portion 1-1 has in the width direction of the chip component 42 a width L4 which is substantially the same as the width L2 of the chip component 42, and in the longitudinal direction of the chip component 42 a length L6 which is larger than the length L5 of the projection 1-2. Thus, the movement of the chip component 42 can be restricted by the effect of self-alignment. To ensure that the side fillets 43-2 form an appropriate shape, it is preferable that the length L5 of the projection 1-2 which projects from restriction portion 1-1 be sufficiently large. However, the large length L5 also lowers the packing density. Thus, it is preferable that the length L5 should be optionally set according to the desired packing density. The projections 1-2 have, in the longitudinal direction of the chip component 42, a width L7 which is larger than the length L8 of the side face of the electrode of the chip component 42.

In the land 1, as shown in FIG. 3A, the end (or the portion indicated by the dotted line B) of the land 1 which faces the bottom surface of the chip component may project toward another facing land 1' which is used in mounting the chip component 42. This makes it easier to form the solder between the bottom surface of the chip component 42 and the above end of the land 1 into an appropriate fillet. This further alleviates the effects of thermal stress.

The shape of the projection 1-2 is not limited to substantially a rectangular shape as shown in FIG. 3A. As an example, FIG. 3C shows that the projection 1-2 may be formed in a semicircular shape (or a sector shape) having a diameter which is larger than the length of the electrode of the chip component 42.

As shown in FIGS. 3A-3C, the land 1 is formed such that it is comprised of the restriction portion 1-1 and a pair of projections 1-2 which facilitate forming the solder into fillets which face the end face and the side faces of the chip component 42. Consequently, the crack resistance of the solder is improved.

It will be appreciated by persons skilled in the art that the present invention is not limited to what has been particularly shown and described hereinabove. Rather, the scope of the present invention is defined by the claims which follow. It should further be understood that the above description is only representative of illustrative example of embodiments. For the reader's convenience, the above description has focused on a representative sample of possible embodiments and a sample that teaches the principles of the present invention. Other embodiments may result from a different combination of portions of different embodiments. The description has not attempted to exhaustively enumerate all possible variations. The alternate embodiments may not have been presented for a specific portion of the invention and may result from a different combination of described portions or that other undescribed alternate embodiments may be available for a portion, is not be considered a disclaimer of those alternate embodiments. It will be appreciated that many of those undescribed embodiments are within the literal scope of the following claims and others are equivalent.

What is claimed is:

1. A surface mounting structure for a surface mounting electronic component, comprising:
   an electronic component having electrodes at opposite ends thereof, the electronic component being a chip component including a chip resistor and a chip capacitor;
   a land each of which is connected directly to the respective electrode of the electronic component by soldering;
   a wiring connected to the land, the wiring having a width which is smaller than a width of the electronic component in a width direction thereof;
   an electrical connection pattern having on a side on which the wiring is connected to the electrical connection pattern a width which is larger than the width of the electronic component in the width direction thereof; and
   a metal substrate on which the electronic component is mounted, the metal substrate on which the land, the wiring and the electrical connection pattern is formed,
   wherein the land includes a restriction portion for the solder to form thereon into a fillet which faces an end face of the electronic component in a direction perpendicular to the longitudinal direction of the electronic component, and which restricts movement of the electronic component in melting the solder, and a projection for the solder to form thereon into a fillet which faces a side face of the electronic component in the longitudinal direction of the electronic component, and the wiring is connected to the land at the projection.

2. The surface mounting structure according to claim 1, wherein the wiring is formed so as to incline with respect to a longitudinal direction of the electronic component.

3. The surface mounting structure according to claim 1, wherein the wiring is formed so as to extend perpendicularly to a longitudinal direction of the electronic component.

4. The surface mounting structure according to claim 1, wherein the wiring has a shape in the form of a curve or a bend.

5. The surface mounting structure according to claim 4, wherein the wiring is formed substantially in an L shape.

6. The surface mounting structure according to claim 1, wherein the wiring is formed so as to branch.

7. The surface mounting structure according to claim 6, wherein the wiring is formed substantially in a T shape.

8. The surface mounting structure according to claim 1, wherein a plurality of the electronic components are connected in parallel to each other through the wiring or the electrical connection pattern.

9. The surface mounting structure according to claim 1, wherein the restriction portion has in the width direction of the electronic component a width which is substantially the same as the width of the electronic component.

10. The surface mounting structure according to claim 1, wherein the restriction portion has in the longitudinal direction of the electronic component a length which is larger than a length of the projection in the width direction of the electric component.

11. The surface mounting structure according to claim 1, wherein the projection has in the longitudinal direction of the electronic component a width which is larger than a length of a side face of the electrode in the longitudinal direction of the electronic component.

12. The surface mounting structure according to claim 1, wherein the projection is formed in a semicircular shape.

13. The surface mounting structure according to claim 1, wherein the electronic component serves as a power device, and an in-vehicle power supply circuit including the power device is formed on the metal substrate.

14. The surface mounting structure according to claim 1, wherein the metal substrate includes a vertical portion, and a glass-epoxy substrate is provided on the vertical portion.

\* \* \* \* \*